(12) United States Patent
Komatsubara

(10) Patent No.: US 6,977,205 B2
(45) Date of Patent: Dec. 20, 2005

(54) METHOD FOR MANUFACTURING SOI LOCOS MOSFET WITH METAL OXIDE FILM OR IMPURITY-IMPLANTED FIELD OXIDE

(75) Inventor: Hirotaka Komatsubara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/765,156

(22) Filed: Jan. 28, 2004

(65) Prior Publication Data

US 2005/0062129 A1    Mar. 24, 2005

(30) Foreign Application Priority Data

Sep. 19, 2003  (JP)  ............................... 2003-328092

(51) Int. Cl.$^7$ ...................... H01L 21/76; H01L 21/00; H01L 21/84; H01L 21/425
(52) U.S. Cl. ...................... 438/439; 438/149; 438/151; 438/297; 438/400; 438/525
(58) Field of Search ............................... 438/106, 525, 438/439, 149, 151, 297, 400

(56) References Cited

U.S. PATENT DOCUMENTS

| | | | | |
|---|---|---|---|---|
| 3,809,574 | A | * | 5/1974 | Duffy et al. ................. 438/778 |
| 5,696,399 | A | * | 12/1997 | Cereda et al. ............... 257/385 |
| 5,863,823 | A | * | 1/1999 | Burgener .................... 438/295 |
| 5,899,723 | A | * | 5/1999 | Chen et al. ................. 438/309 |
| 6,566,712 | B2 | | 5/2003 | Hayashi et al. |

FOREIGN PATENT DOCUMENTS

| | | | |
|---|---|---|---|
| EP | 0213972 | * 11/1987 | ......... H01L 21/265 |
| JP | 01-138730 | 5/1989 | |
| JP | 07-115125 | 5/1995 | |
| JP | 2000-306994 | 11/2000 | |
| JP | 2001-102571 | 4/2001 | |
| JP | 2001-148418 | 5/2001 | |
| JP | 2003-124303 | 4/2003 | |

OTHER PUBLICATIONS

Yasushiro Nishioka, et al., IEEE Transactions on Nuclear Science, vol. 37, No. 6, Dec. 1990.*
D. Niu, et al., Journal of Applied Physics, vol. 91, No. 6, May 1, 2002.*
Thomas et al., Characteristics of Submicrometer LOCOS Isolation, Proceedings 1995 International SOI conference, Oct. 1995, P116-117.

(Continued)

Primary Examiner—Craig A. Thompson
Assistant Examiner—Heather Doty
(74) Attorney, Agent, or Firm—Rabin & Berdo, PC

(57) ABSTRACT

This invention provides a semiconductor device with an element isolation implemented by a method of manufacturing a semiconductor device comprising the steps of: forming a pad oxide film 140 and a nitride film 150 sequentially on a silicon layer 130 in an element region S; forming a metal oxide film 180 for generating a fixed electric charge on the nitride film 150 and on the silicon layer 130 in an element isolation region A; forming a field oxide film 160 in the element isolation region A by implementing an oxidation treatment; and removing the metal oxide film 180 on the nitride film 150, the nitride film 150 and the pad oxide film 140. In the semiconductor device, the threshold voltage of a parasitic transistor is made high and prevented from turning on, and the influence of leak current is reduced and the hump characteristic of element is restrained.

11 Claims, 6 Drawing Sheets

OTHER PUBLICATIONS

Okano et al., Fabrication of a Miniature-Size Pyramidal-Shape Diamond Field Emitter Array, IEEE Electron Device Letters, vol. 16, No. 6, Jun. 1995.

Kang et al., Reduction of Leakage Current at the Gate Edge of SDB SOI NMOS Transistor, IEEE Electron Device Letters, vol. 16, No. 6, Jun. 1995.

* cited by examiner

METHOD FOR MANUFACTURING SOI LOCOS MOSFET WITH METAL OXIDE FILM OR IMPURITY-IMPLANTED FIELD OXIDE

BACKGROUND OF THE INVENTION

1. Field of the Invention

The present invention relates to a semiconductor device. More specifically, the present invention relates to a semiconductor device and its manufacturing method in which a leak current between elements due to a parasitic transistor formed at an element isolation part is reduced by using an SOI (Silicon On Insulator) substrate as a semiconductor substrate and using a LOCOS (Local Oxidation of Silicon) method as an element isolation technology for the SOI substrate.

2. Description of the Related Art

Recently, for the purpose of improving a threshold characteristic and reducing a parasitic capacity, an SOI substrate with a silicon layer formed on an insulative layer called BOX oxide film is in heavy usage as a substrate to form a semiconductor element.

Element isolation is implemented on the silicon layer (SOI layer) by a trench structure (trench isolation method) or a LOCOS method. A MOSFET element on the SOI substrate is manufactured on the SOI substrate through a process similar to the one of manufacturing a conventional MOSFET element. The manufacturing process of MOSFET element on an SOI substrate using a LOCOS method will be explained as follows.

Element isolation by a LOCOS method is disclosed in the document "J. W. Thomas et al., Proceedings IEEE Intr. SOIconf., 116 (1995)". First, according to the document, an oxide film to be a pad oxide film is formed on an SOI substrate. Second, patterning is implemented by a conventional photolithography method using a resist as an optical mask after a nitride film is accumulated. And then the pad oxide film and the nitride film in an element isolation region are removed.

Next, heat treatment is implemented to form a field oxide film (LOCOS oxide film) in an element isolation region. Due to the limit of the thickness of SOI layer, the field oxide layer does not become far thicker than the SOI layer, different from that of a MOSFET with bulk structure. After forming the LOCOS oxide film, the nitride film and the pad oxide film are removed. After that, a gate oxide film, an electrode, a source and a drain are formed similar to the process of manufacturing a conventional MOSFET.

The manufacturing process as explained above is only one example, and there are some modifications of the process in which, for example, an LDD (Lightly Doped Drain) structure is formed in forming a MOSFET with a conventional substrate. However, the explanations of the modifications are omitted here since the explanations have no relation with the substance of the present invention.

In this LOCOS method, an edge region, a silicon layer, with the section of triangular shape, is formed between a BOX oxide film and the LOCOS oxide film, and the layer becomes a parasitic MOSFET. This parasitic MOSFET has a bad influence on the MOSFET element, a leak current is increased and a hump characteristic in which a hump seems to be at a current characteristic of the element is caused. For this reason, the threshold voltage in the MOSFET with the parasitic MOSFET becomes lower than the one in the MOSFET without the parasitic MOSFET.

On the other hand, a trench structure in which a silicon layer is etched to form a groove and in which an oxide film is embedded in the groove is disclosed in the document "IEEE ELECTRON DEVICE LETTERS, VOL. 6, JUNE 1995" and so on. Also, there is disclosed in the document "S-W Kang IEEE EDL-16, no. 6 1995" that the trouble of hump characteristic causing trouble in the LOCOS method can be resolved by the trench structure (trench isolation method).

The trench isolation method, however, needs to include a step of forming a groove in an element isolation region and removing an oxide film deposited on the part other than the groove, which increases the manufacturing steps comparing to the LOCOS method and makes the manufacturing cost high. For this reason, the isolation method cannot be employed to an element with low cost needed.

In view of this problem, a method of improving the hump characteristic using the LOCOS method is disclosed in the following patent documents. A method of improving a LOCOS edge shape on which a parasitic MOSFET is formed is disclosed in Japanese Patent Laid-open Publication No. 2000-306994 and a method of preventing a parasitic MOSFET from turning on by implanting an impurity into an edge region to increase an edge concentration is disclosed in Japanese Patent Laid-open Publication No. 2003-124303.

Also, a method of restraining a leak current by implanting an impurity by forming a groove in a LOCOS isolation region is disclosed in Japanese Patent Laid-open Publication No. 07-115125, and a method of reducing a leak current in an element isolation method in an element isolation method using the trench structure is disclosed in Japanese Patent Laid-open Publication No. 01-138730 and Japanese Patent Laid-open Publication No. 2001-148418. Further, a structure with fluorine implanted into a gate insulating film so that the concentration distribution can be appropriate, for the purpose of improving a dielectric breakdown resistance, is disclosed in Japanese Patent Laid-open Publication No. 2001-102571.

However, even those methods cited above are employed to the element isolation using the LOCOS method, the hump characteristic cannot be completely restrained, and, in a method of increasing an edge concentration by implanting an impurity into an edge region, the impurity in the edge region is diffused into the element part to have a bad influence on the characteristic of the element.

SUMMARY OF THE INVENTION

The present invention has been achieved in view of aforementioned problems. The object of the present invention is to provide a novel and improved semiconductor device and its manufacturing method capable of reducing the influence of leak current due to a parasitic transistor as much as possible and capable of restraining the hump characteristic of element in a semiconductor substrate with element isolation implemented.

In one aspect of the present invention to achieve the above object, there is provided a semiconductor device in an element isolation region using a LOCOS method comprising: a silicon layer having an inclined part in a sectional shape; a metal oxide film for generating a fixed electric charge, formed on the silicon layer having the inclined part; and a field oxide film formed on the metal oxide layer.

With this structure, since the threshold voltage of a parasitic transistor formed between the silicon layer and the field oxide film can be made high by forming the metal oxide film generating a fixed electric charge on the silicon layer in the element isolation region, the influence of leak current can be reduced and the hump characteristic of element can be restrained. Here, the structure of element may be a bulk structure. However, when the silicon layer has an SOI structure with the silicon layer formed on an insulating layer, the fixed electric charge can be generated from a metal oxide film formed on an edge region of the silicon layer at a border with the element isolation region and the threshold voltage of the parasitic transistor formed in the edge region can be made high. Consequently, the hump characteristic can be effectively restrained.

To obtain the semiconductor device as described above, there is provided a method of manufacturing a semiconductor device comprising the steps of: forming a pad oxide film and a nitride film sequentially on a silicon layer in an element region; forming a metal oxide film for generating a fixed electric charge on the nitride film and on the silicon layer in an element isolation region; forming a field oxide film in the element isolation region by implementing an oxidation treatment; and removing the metal oxide film on the nitride film, the nitride film and the pad oxide film.

Or, in another aspect of the present invention, there can be provided a method of manufacturing a semiconductor device comprising the steps of: forming a pad oxide film and a nitride film sequentially on a silicon layer in an element region; forming a field oxide film in an element isolation region by implementing an oxidation treatment; implanting an impurity into the field oxide film to generate a fixed electric charge on the field oxide film; and removing the nitride film and the pad oxide film.

According to the present invention as described above, by forming a metal oxide film generating a fixed electric charge between a silicon layer and a field oxide film each in an element isolation region, or by generating a fixed electric charge on a field oxide film on a silicon layer, the threshold voltage of a parasitic transistor formed between the silicon layer and the field oxide film can be made high and the influence of leak current can be reduced and the hump characteristic of element can be restrained.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
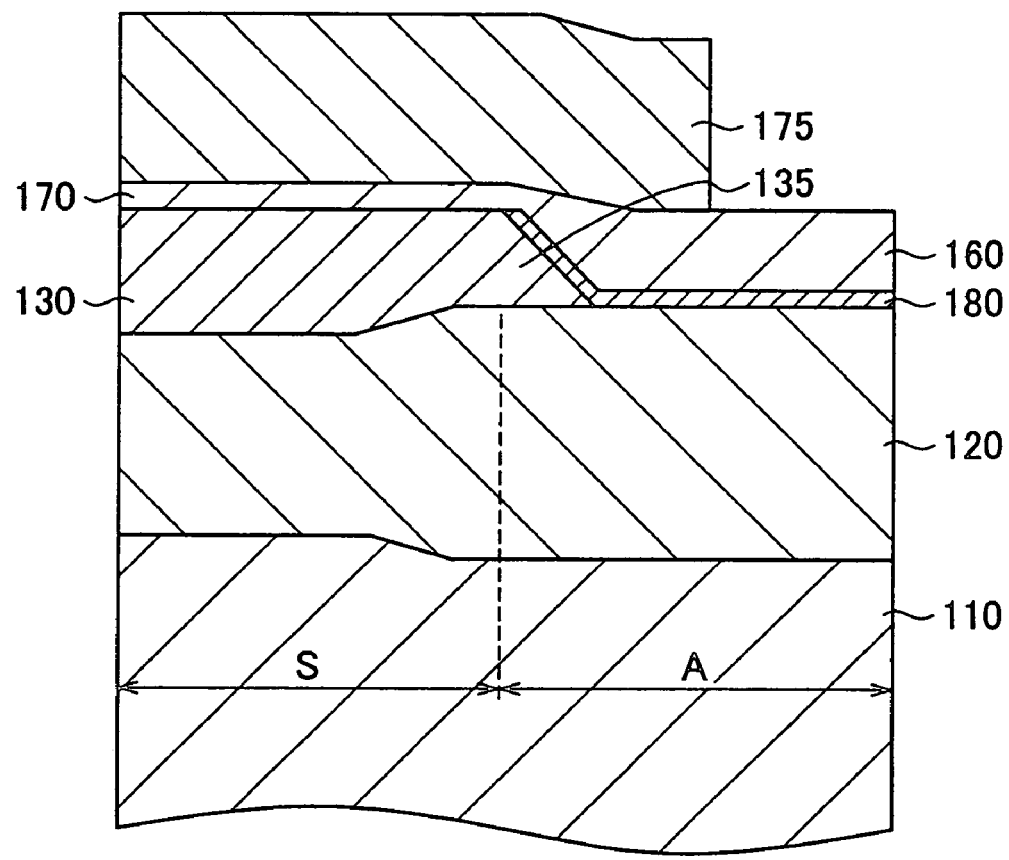
FIG. 1 is a sectional view showing a semiconductor device in the first embodiment.

Hereinafter, the preferred embodiment of the present invention will be described in reference to the accompanying drawings. Same reference numerals are attached to components having same functions in following description and the accompanying drawings, and a description thereof is omitted.

(First Embodiment)

FIG. 1 is a sectional view showing a border between an element part and an element isolation region in a channel direction of a semiconductor device having an SOI structure in this embodiment. Referring to FIG. 1, each element is electrically isolated by a field oxide film 160 using a LOCOS method in the semiconductor device. In an element region S, a gate oxide film 170 is formed on e.g., a P-type silicon layer 130 formed on a BOX oxide film layer 120 of a substrate 110. And a gate electrode 175 is formed on the gate oxide film 170 to form an N-channel MOSFET.

Figure 2A:
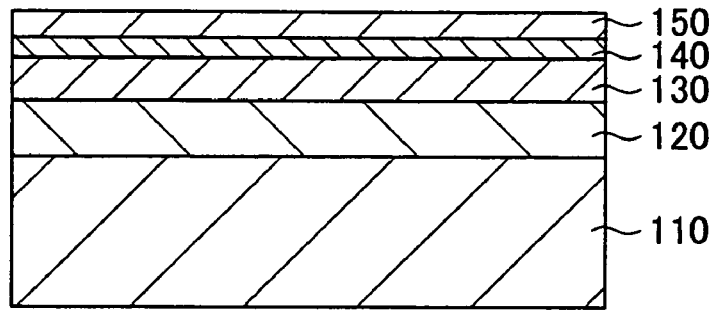
FIG. 2A is a sectional view of process showing schematically a method of manufacturing a semiconductor device in the first embodiment and a process after a pad oxide film and a nitride film are formed on an SOI layer.
Figure 2B:
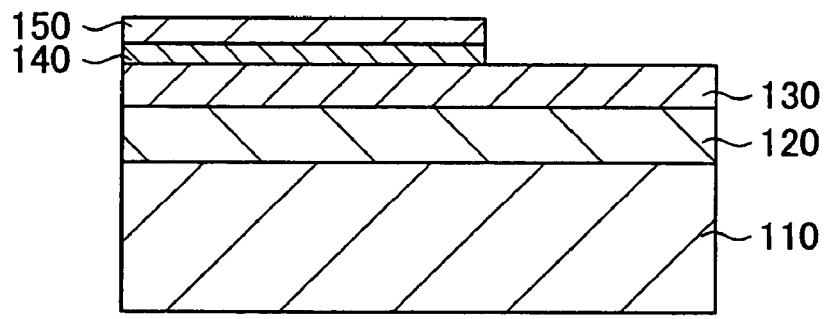
FIG. 2B is a sectional view of process showing schematically a method of manufacturing a semiconductor device in the first embodiment and a process after a pad oxide film and a nitride film in an element isolation region are removed.
Figure 2C:
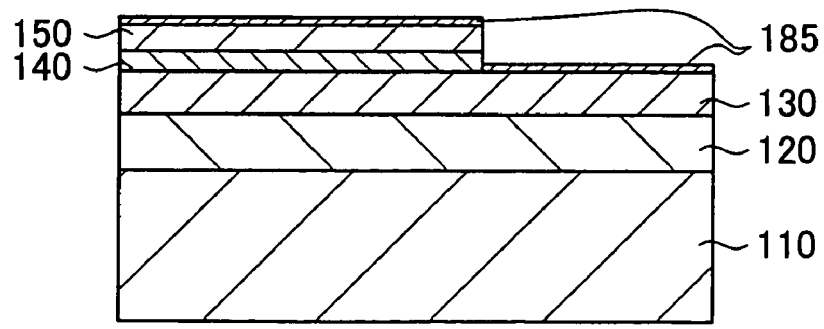
FIG. 2C is a sectional view of process showing schematically a method of manufacturing a semiconductor device in the first embodiment and a process after a metal oxide film is formed.
Figure 2D:
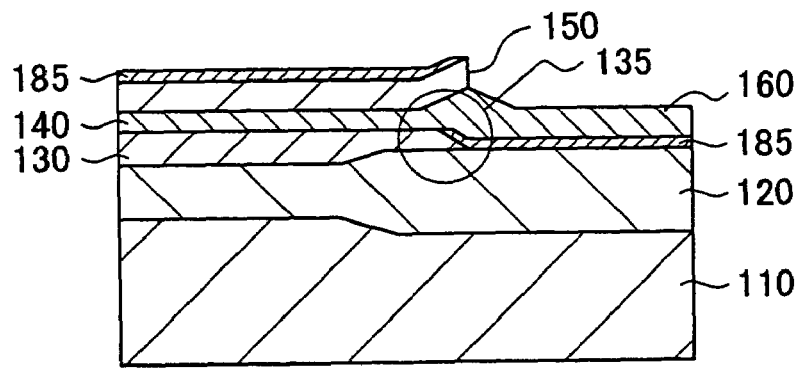
FIG. 2D is a sectional view of process showing schematically a method of manufacturing a semiconductor device in the first embodiment and a process after a field oxide film is formed.

In an element isolation region A, a metal oxide film 180, e.g., aluminum oxide (Al2O3) is formed on the silicon layer 130 having an inclined part in a sectional shape (e.g., the inclined edge of the silicon layer 130 shown within circle 135 in FIG. 2D) and on the BOX oxide film layer 120. And the field oxide film 160 is formed thereon.

Especially, in the element isolation region A, a triangular-shaped edge region 135 of the silicon layer 130 surrounded with the BOX oxide film layer 120 and the field oxide film 160 becomes a parasitic MOSFET (N-channel MOSFET), causes a hump characteristic and has a bad influence on the characteristics of the element. With the structure of the element isolation region A in this embodiment, by forming the metal oxide film 180 (e.g., $Al_2O_3$), a reaction is induced with $Al_2O_3$ at an Si interface of the silicon layer 130 and a defect is formed at the interface of Si.

Since a negative fixed electric charge is included in the defect of $Al_2O_3$, the flat band voltage of the edge region increases and the threshold value of the parasitic N-channel MOSFET can also be raised. Thereby the parasitic N-channel MOSFET becomes difficult to turn on, the hump characteristic is restrained and the influence on the element can be reduced. Although $Al_2O_3$ is employed in this embodiment, other metal oxide film including a negative fixed electric charge, e.g., hafnium oxide can be employed.

When an SOI layer is N-type and the element is a P-channel MOSFET, a parasitic P-channel MOSFET is formed in the edge region, as a matter of course. In this case, since the opposite effect is produced by forming $Al_2O_3$, it is preferable to form an oxide film including a positive fixed electric charge. In this embodiment, an explanation will be provided in the case of N-channel MOSFET.

Next, a method of manufacturing a semiconductor device in this embodiment will be explained. FIGS. 2A–F are sectional views of processes showing a border between an element part and an element isolation region in a channel direction of a semiconductor device in this embodiment. First, the BOX oxide film layer 120 with a thickness of approximately 1500 Å and the silicon layer 130 with a thickness of approximately 500 Å are sequentially formed on the substrate 110, and a pad oxide film 140 is formed on the silicon layer 130 at a thickness of approximately 70 Å, and further, a nitride film 150 is accumulated thereon at a thickness of approximately 1000 Å (FIG. 2A). The pad oxide film 140 has the effect of improving the adhesion between the silicon layer 130 and the nitride film 150.

After that, patterning is implemented by a photolithography method to remove the pad oxide film 140 and the nitride film 150 each in the element isolation region, and the silicon layer 130 becomes exposed (FIG. 2B). Next, aluminum oxide ($Al_2O_3$) 185, for example, is formed as a metal oxide film on the nitride film 150 and on the silicon layer 130, at a thickness of approximately 20 Å, by using a sputtering device or a CVD method (FIG. 2C).

Implementing heat treatment with $Al_2O_3$ 185 formed, the field oxide film 160 is formed in the element isolation region in the direction of thickness at a thickness of approximately 1000 Å (FIG. 2D). This heat treatment is implemented by dry oxidation for 60 minutes and at a temperature of approximately 1000° C., for example. By forming the field oxide film 160, elements adjacent to each other are electrically isolated. And at the part near the element region, the nitride film 150 is lifted to form the edge region 135 referred to as bird's beak of the silicon layer 130 at a length of approximately 500 Å.

The edge region 135 is a part to be a parasitic MOSFET, as described above. In the parasitic MOSFET in this embodiment, however, since $Al_2O_3$ 185, a metal oxide film, is formed on the silicon layer 130 and a negative fixed electric charge is generated at the interface of the silicon layer 130 in $Al_2O_3$ 185, the flat band voltage of the edge region and the threshold value of the parasitic N-channel MOSFET increase.

Figure 2E:
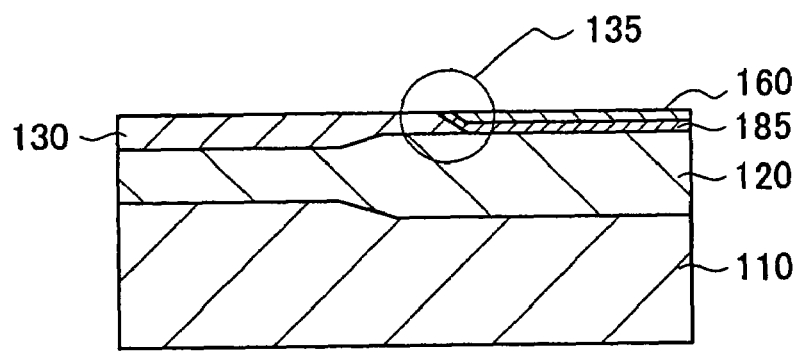
FIG. 2E is a sectional view of process showing schematically a method of manufacturing a semiconductor device in the first embodiment and a process after a pad oxide film and a nitride film are removed.
Figure 2F:
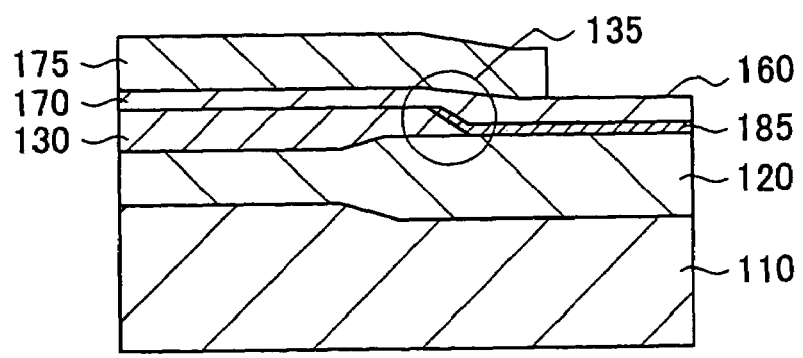
FIG. 2F is a sectional view of process showing schematically a method of manufacturing a semiconductor device in the first embodiment and a process after a gate oxide film and a gate electrode are formed.

And then, as in the related art, removing the nitride film 150 and the pad oxide film 140 as shown in FIG. 2E, the gate oxide film 170 is formed at a thickness of approximately 30 Å as shown in FIG. 2F, and a gate electrode 175 of, for example, polysilicon and source/drain regions (not shown) are formed, and then the element region is completed. The above formation of oxide film, nitride film and so on are implemented by, for example, a CVD method. In addition, this first embodiment is characterized in that the metal oxide film is formed on the silicon layer in the element isolation region before the field oxide film is formed. With regard to other manufacturing processes, other various methods can be employed.

Figure 4:
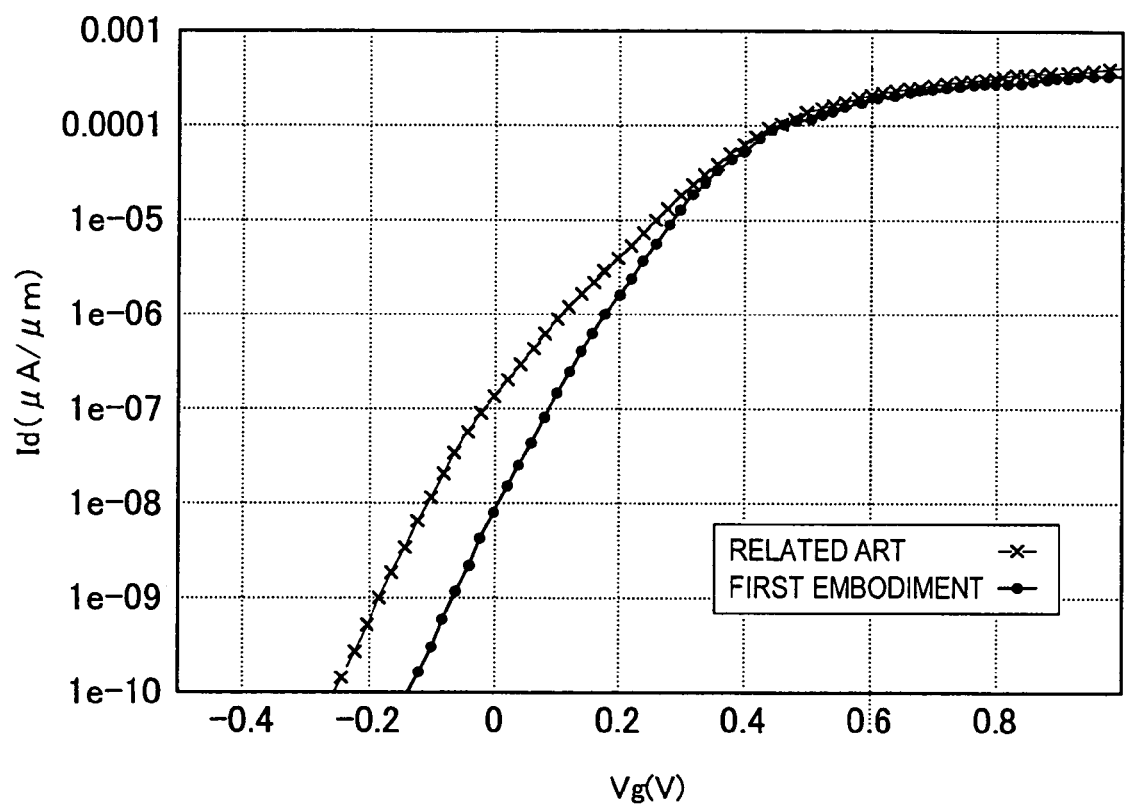
FIG. 4 is an illustration showing a comparison between the relation of drain current and gate voltage in the first embodiment and the one in the related art.

FIG. 4 shows Id-Vg characteristic in this embodiment. In addition, FIG. 4 shows that the effects are obtained that the threshold value of the parasitic N-channel MOSFET generated in the edge region in the element isolation region can be raised, that the hump characteristic can be more restrained than in the related art and that the leak characteristic can be improved.

(Second Embodiment)

Figure 3A:
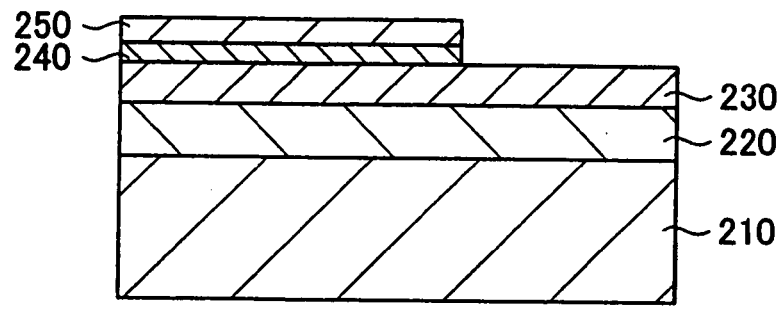
FIG. 3A is a sectional view of process showing schematically a method of manufacturing a semiconductor device in the second embodiment and a process after a pad oxide film and a nitride film are formed in an element region.

A method of manufacturing a semiconductor device in the second embodiment will be explained. FIGS. 3A–E are sectional views showing a border between an element part and an element isolation region in a channel direction of a semiconductor device having an SOI structure in this embodiment. The processes up until the step of forming a field oxide film are the same as the ones in the related art. First, a BOX oxide film layer 220 with a thickness of approximately 1500 Å and a P-type silicon layer 230 with a thickness of approximately 500 Å are sequentially formed on a substrate 210, and a pad oxide film 240 is formed on the silicon layer 230 at a thickness of approximately 70 Å, and further, a nitride film 250 is accumulated thereon at a thickness of approximately 1000 Å. After that, patterning is implemented by a photolithography method to remove the pad oxide film 240 and the nitride film 250 in the element isolation region (FIG. 3A). The element is an N-channel MOSFET.

Figure 3B:
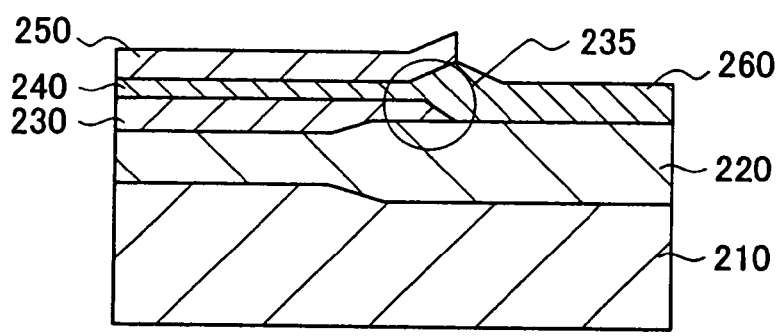
FIG. 3B is a sectional view of process showing schematically a method of manufacturing a semiconductor device in the second embodiment and a process after a field oxide film is formed.

Implementing heat treatment, a field oxide film 260 is formed in the element isolation region in the direction of thickness at a thickness of approximately 1000 Å (FIG. 3B). This heat treatment is implemented by dry oxidation for 60 minutes and at a temperature of approximately 1000° C., for example. By forming the field oxide film 260, elements adjacent to each other are electrically isolated. And at the part near the element region, an edge region 235 to be a parasitic MOSFET is formed.

Figure 3C:
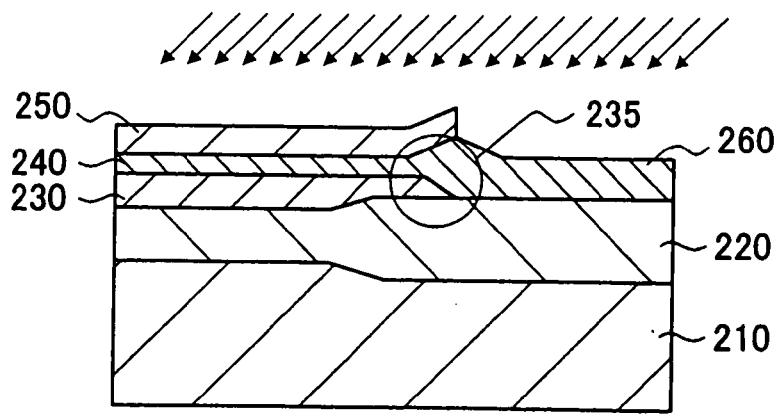
FIG. 3C is a sectional view of process showing schematically a method of manufacturing a semiconductor device in the second embodiment and a process after an ion implantation of fluorine ion is implemented.

Next, in order to generate a negative fixed electric charge on the field oxide film 260 as shown in FIG. 3C, an impurity, for example, fluorine ions are implanted into the whole surface of the substrate by an ion implantation method after forming the field oxide film 260. At this time, it is preferable to implement at an angle of approximately 30°–45° in order to implant the fluorine ions effectively into the field oxide film 260 on the inclined silicon layer 230 in the edge region 235 (i.e., the inclined edge of the silicon layer 230 shown within circle 235 in FIG. 3B). FIG. 3C shows that the diagonal ion implantation is directed generally perpendicular to the inclined edge of the silicon layer 230. It is also preferable to set the energy of implantation approximately at 10–15 keV.

Figure 3D:
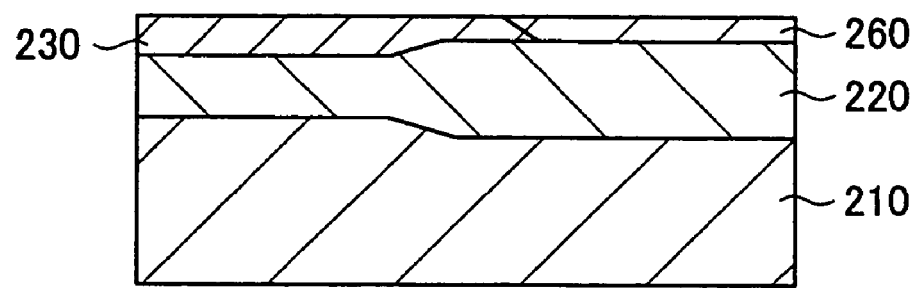
FIG. 3D is a sectional view of process showing schematically a method of manufacturing a semiconductor device in the second embodiment and a process after a pad oxide film and a nitride film are removed.
Figure 3E:
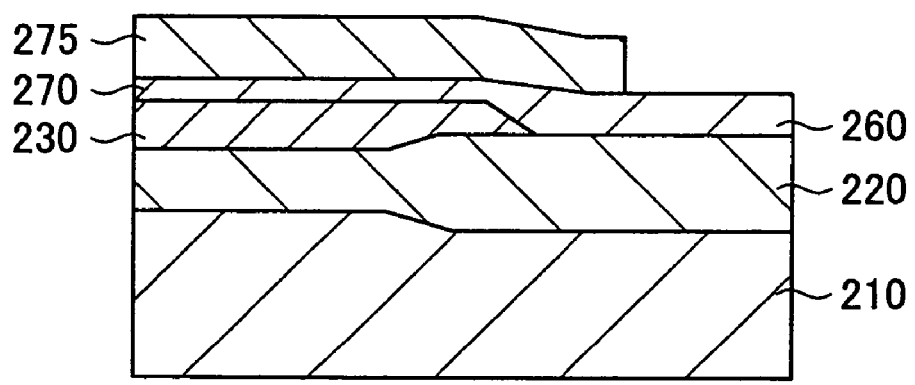
FIG. 3E is a sectional view of process showing schematically a method of manufacturing a semiconductor device in the second embodiment and a process after a gate oxide film and a gate electrode are formed.

And then, as in the related art, removing the nitride film 250 and the pad oxide film 240 as shown in FIG. 3D, a gate oxide film 270 is formed at a thickness of approximately 30 Å as shown in FIG. 3E, and a gate electrode 275 of, for example, polysilicon and source/drain regions (not shown) are formed, and then the element region is completed. In addition, this second embodiment is characterized in that a fluorine ion is implanted into an edge region after a field oxide film is formed. With regard to other manufacturing processes, other various methods can be employed.

By implanting the fluorine ions into the field oxide film 260 at the interface of the silicon layer in the edge region 235, since a negative fixed electric charge is generated at the interface of the silicon layer 230 in the field oxide film 260, the flat band voltage of the edge region and the threshold value of the parasitic N-channel MOSFET increase.

According to the second embodiment as described above, since a negative fixed electric charge in the oxide film generated by fluorine ion implantation raises the threshold value of the parasitic MOSFET in the edge region, the parasitic N-channel MOSFET becomes difficult to turn on, the hump characteristic is restrained and the influence on the element can be reduced.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

What is claimed is:

1. A method of manufacturing a semiconductor device using a LOCOS method for element isolation comprising the steps of:

forming a pad oxide film and a nitride film sequentially on a silicon layer in an element region;

forming a metal oxide film for generating a fixed electric charge on the nitride film and on the silicon layer at least in an edge region of an element isolation region;

forming a field oxide film in the element isolation region by implementing an oxidation treatment; and removing the metal oxide film on the nitride film, the nitride film and the pad oxide film;

whereby a threshold voltage of a parasitic transistor formed between the silicon layer and the field oxide film is raised and an influence of leakage current is reduced.

2. The method of manufacturing a semiconductor device according to claim 1 wherein the silicon layer is a silicon layer of an SOI structure formed on an insulating oxide layer.

3. The method of manufacturing a semiconductor device according to claim 1, wherein the step of forming a field oxide film in the element isolation region by implementing an oxidation treatment comprises:

forming an inclined edge of the silicon layer; and covering the inclined edge with a metal oxide film.

4. The method of manufacturing a semiconductor device according to claim 1 wherein the element is an N-channel MOSFET and the fixed electric charge is a negative fixed electric charge.

5. The method of manufacturing a semiconductor device according to claim 4 wherein the metal oxide film is aluminum oxide.

6. A method of manufacturing a semiconductor device using a LOCOS method for element isolation comprising the steps of:

forming a pad oxide film and a nitride film sequentially on a silicon layer in an element region;

forming a field oxide film in an element isolation region by implementing an oxidation treatment;

implanting an impurity into the field oxide film at least in an edge region of the element isolation region to generate a fixed electric charge on the field oxide film; and removing the nitride film and the pad oxide film;

whereby a threshold voltage of a parasitic transistor formed between the silicon layer and the field oxide film is raised and an influence of leakage current is reduced.

7. The method of manufacturing a semiconductor device according to claim 6 wherein the silicon layer is a silicon layer of an SOI structure formed on an insulating oxide layer.

8. The method of manufacturing a semiconductor device according to claim 6 wherein the impurity is implanted by a diagonal ion implantation.

9. The method of manufacturing a semiconductor device according to claim 8, wherein the step of forming a field oxide film in the element isolation region by implementing an oxidation treatment comprises forming an inclined edge of the silicon layer; and the step of implanting an impurity into the field oxide film comprises directing the diagonal ion implantation generally perpendicular to the inclined edge.

10. The method of manufacturing a semiconductor device according to claim 6 wherein the element is an N-channel MOSFET and the fixed electric charge is a negative fixed electric charge.

11. The method of manufacturing a semiconductor device according to claim 10 wherein the impurity is a fluorine ion.

* * * * *